United States Patent
Yang

(10) Patent No.: US 10,090,326 B2
(45) Date of Patent: Oct. 2, 2018

(54) FLEXIBLE DISPLAY SUBSTRATE AND A MANUFACTURING METHOD THEREOF, AS WELL AS A FLEXIBLE DISPLAY DEVICE

(71) Applicant: BOE TECHNOLOGY GROUP CO., LTD., Beijing (CN)

(72) Inventor: Jing Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/527,717

(22) Filed: Oct. 29, 2014

(65) Prior Publication Data

US 2015/0333115 A1    Nov. 19, 2015

(30) Foreign Application Priority Data

May 16, 2014    (CN) .......................... 2014 1 0207010

(51) Int. Cl.
     *H01L 27/32*          (2006.01)
     *H01L 29/786*        (2006.01)
     (Continued)

(52) U.S. Cl.
     CPC .......... *H01L 27/12* (2013.01); *H01L 21/6835* (2013.01); *H01L 21/77* (2013.01);
     (Continued)

(58) Field of Classification Search
     CPC ....... H01L 2227/323; H01L 2251/5338; H01L 23/552; H01L 27/3272; H01L 29/7869; H01L 51/5237; H01L 51/5284
     See application file for complete search history.

(56) References Cited

U.S. PATENT DOCUMENTS

| 2009/0230390 A1* | 9/2009 | Gosain ................ H01L 29/4908 257/43 |
| 2012/0104430 A1* | 5/2012 | Kim .................... H01L 51/5268 257/91 |
| 2013/0328043 A1* | 12/2013 | Lee ..................... H01L 33/0041 257/43 |

FOREIGN PATENT DOCUMENTS

| CN | 102569347 | 7/2012 |
| CN | 103474583 | 12/2013 |

(Continued)

OTHER PUBLICATIONS

Koh et al. Enhanced Light Trapping in Thin-Film Solar Cells. SPIE Newsroom. http://spie.org/newsroom/2654-enhanced-light-trapping-in-thin-film-solar-cells?SSO=1, Mar. 31, 2010, DOI: 10.1117/2.1201003.002654.*

(Continued)

*Primary Examiner* — Raj R Gupta
(74) *Attorney, Agent, or Firm* — Womble Bond Dickinson (US) LLP

(57) ABSTRACT

The embodiments of the present invention provide a flexible display substrate and a manufacturing method thereof, as well as a flexible display device, which relate to the technical field of display, and can avoid the performance of the thin film transistor from being influenced by light energy when a flexible substrate is striped from a carrying substrate. The method for manufacturing the flexible display substrate may comprise: forming a flexible substrate on a carrying substrate; forming a first buffer layer on the flexible substrate; forming a plurality of display elements on the first buffer layer, each of the plurality of display elements comprising a thin film transistor and an electrode structure, the thin film transistor comprising a metal oxide semiconductor active layer; stripping the flexible substrate from the carrying substrate, wherein the method further comprises: form- (Continued)

ing a light absorbing layer before the plurality of display elements are formed.

6 Claims, 5 Drawing Sheets

(51) Int. Cl.
    *H01L 51/52*     (2006.01)
    *H01L 27/12*     (2006.01)
    *H01L 29/66*     (2006.01)
    *H01L 29/24*     (2006.01)
    *H01L 51/56*     (2006.01)
    *H01L 21/77*     (2017.01)
    *H01L 23/552*     (2006.01)
    *H01L 21/683*     (2006.01)

(52) U.S. Cl.
    CPC ........ *H01L 23/552* (2013.01); *H01L 27/1218* (2013.01); *H01L 27/1225* (2013.01); *H01L 27/3248* (2013.01); *H01L 27/3272* (2013.01); *H01L 29/24* (2013.01); *H01L 29/66969* (2013.01); *H01L 29/7869* (2013.01); *H01L 29/78603* (2013.01); *H01L 29/78633* (2013.01); *H01L 51/5237* (2013.01); *H01L 51/5284* (2013.01); *H01L 51/56* (2013.01); *H01L 2221/6835* (2013.01); *H01L 2221/68318* (2013.01); *H01L 2221/68381* (2013.01); *H01L 2227/323* (2013.01); *H01L 2227/326* (2013.01); *H01L 2251/5338* (2013.01); *H01L 2924/0002* (2013.01)

(56) References Cited

FOREIGN PATENT DOCUMENTS

| | | |
|---|---|---|
| CN | 103500745 | 1/2014 |
| CN | 103500756 | 1/2014 |
| CN | 203503661 | 3/2014 |

OTHER PUBLICATIONS

Chinese Office Action with English Language Translation, dated Apr. 5. 2016, Chinese Application No. 201410207010.2.

\* cited by examiner

FLEXIBLE DISPLAY SUBSTRATE AND A MANUFACTURING METHOD THEREOF, AS WELL AS A FLEXIBLE DISPLAY DEVICE

FIELD OF THE INVENTION

This disclosure relates to the technical field of display, particularly to a flexible display substrate and a preparation method thereof, as well as a flexible display device.

BACKGROUND OF THE INVENTION

The flexible display technology has been developed rapidly in recent years, which brings great progress of the flexible display in both the screen size and the display quality. Both the cathode ray tube (CRT) on the verge of disappearing and the liquid crystal display (LCD) that is the mainstream nowadays belong to the conventional rigid display essentially. Compared with the conventional rigid display, the flexible display has many advantages, for example, impact resistance, strong anti-vibration capability, light weight, small volume, easier for carrying, etc.

Wherein the fabricating method of the flexible display generally comprises: forming a flexible substrate on a carrying substrate, then forming respective film layers and the like that constitute the display elements on the flexible substrate, finally stripping the flexible substrate from the hard carrying substrate by way of e.g. laser irradiation.

However, if the active layer in the thin film transistor that constitutes the display element uses a metal oxide semiconductor active layer, when the flexible substrate is stripped from the hard carrying substrate by way of laser irradiation, the off-state current of the thin film transistor will increase by an order of magnitude, so as to produce influence on the performance of the thin film transistor, thereby making the yield of the product decreased.

SUMMARY OF THE INVENTION

The embodiments of the present invention provide a flexible display substrate and a manufacturing method thereof, as well as a flexible display device, which can avoid or at least mitigate one or more of the above problems.

According to one aspect of the present invention, a flexible display substrate is provided, comprising: a flexible substrate, a first buffer layer arranged on the flexible substrate, a plurality of display elements arranged at a side of the first buffer layer away from the flexible substrate, each of the plurality of display elements comprising a thin film transistor and an electrode structure; wherein the thin film transistor comprises a metal oxide semiconductor active layer, the flexible display substrate further comprises: a light absorbing layer arranged at a lower surface of the flexible substrate or arranged between the flexible substrate and the plurality of display elements.

By means of the above flexible display substrate, the influence of light energy to the performance of the thin film transistor can be avoided when the flexible substrate is stripped from the carrying substrate.

Optionally, the light absorbing layer comprises an amorphous silicon layer.

Optionally, the light absorbing layer is arranged between the flexible substrate and the first buffer layer, and the light absorbing layer contacts with both the flexible substrate and the first buffer layer.

Optionally, the light absorbing layer is arranged between the first buffer layer and the display elements; the flexible display substrate may further comprise a second buffer layer arranged between the light absorbing layer and the plurality of display elements, and the light absorbing layer contacts with both the first buffer layer and the second buffer layer.

Optionally, the electrode structure comprises a cathode and an anode; wherein one of the cathode and the anode is electrically connected with a drain of the thin film transistor; each of the plurality of display elements further comprises an organic material functional layer arranged between the cathode and the anode.

Further, the light absorbing layer may comprise an amorphous silicon layer, and the area of the amorphous silicon layer is smaller than the area of the first buffer layer; and wherein an edge of the light absorbing layer is aligned with the organic material functional layer of the display element in the plurality of display elements that is located at an edge of the flexible display substrate.

Optionally, the electrode structure comprises a pixel electrode; wherein the pixel electrode is electrically connected with a drain of the thin film transistor.

According to another aspect of the present invention, a flexible display device is provided, comprising: a flexible display substrate as stated above.

Optionally, the electrode structure may comprise a cathode and an anode; wherein one of the cathode and the anode is electrically connected with a drain of the thin film transistor; each of the plurality of display elements further comprises an organic material functional layer arranged between the cathode and the anode, moreover, the flexible display device may further comprise an encapsulation layer.

This disclosure further provides a method for manufacturing a flexible display substrate, comprising: forming a flexible substrate on a carrying substrate; forming a first buffer layer on the flexible substrate; forming a plurality of display elements on the first buffer layer, each of the plurality of display elements comprising a thin film transistor and an electrode structure, the thin film transistor comprising a metal oxide semiconductor active layer; stripping flexible substrate from the carrying substrate, wherein the method further comprises: forming a light absorbing layer before the plurality of display elements are formed.

Optionally, the light absorbing layer comprises an amorphous silicon layer.

Optionally, forming the light absorbing layer before the plurality of display elements are formed comprises:

forming the light absorbing layer before the flexible substrate is formed;

or, forming the light absorbing layer after the flexible substrate is formed and before the first buffer layer is formed;

or, forming the light absorbing layer after the first buffer layer is formed and before the plurality of display elements are formed, and the method further comprising: forming a second buffer layer after the light absorbing layer is formed and before the plurality of display elements are formed.

Optionally, the electrode structure may comprise a cathode and an anode; wherein one of the cathode and the anode is electrically connected with a drain of the thin film transistor; each of the plurality of display elements further comprises an organic material functional layer arranged between the cathode and the anode.

Further, the light absorbing layer comprises an amorphous silicon layer, and the area of the amorphous silicon layer is smaller than the area of the first buffer layer; wherein an edge of the light absorbing layer is aligned with the organic material functional layer of the display element in the plurality of display elements that is located at an edge of the flexible display substrate.

Optionally, the electrode structure may comprise a pixel electrode; wherein the pixel electrode is electrically connected with the drain of the thin film transistor.

The embodiments of the present invention provide a flexible display substrate and a manufacturing method thereof, as well as a flexible display device, the flexible display substrate comprising: a flexible substrate, a first buffer layer arranged above the flexible substrate, a plurality of display elements arranged at one side of the first buffer layer away from the flexible substrate, each of the plurality of display elements comprising a thin film transistor and an electrode structure; wherein the thin film transistor comprises a metal oxide semiconductor active layer, wherein the flexible display substrate further comprises: a light absorbing layer arranged at the lower surface of the flexible substrate or arranged between the flexible substrate and the plurality of display elements.

By using a metal oxide semiconductor as the material of the active layer, the thin film transistor can have a higher electron mobility and homogeneity, so as to enable it to be applicable to a large-size flexible display substrate. However, the performance of the thin film transistor comprising a metal oxide semiconductor active layer may be influenced by light energy. By arranging a light absorbing layer, the light energy of e.g., laser can be absorbed in the case of ensuring stripping of the carrying substrate and the flexible substrate, thereby weakening the light energy that reaches the thin film transistor as far as possible, so as to avoid influence to the performance of the thin film transistor and improve yield of the product.

BRIEF DESCRIPTION OF DRAWINGS

In order to explain the embodiments of the present invention or the technical solutions in the prior art more clearly, the drawings that need to be used in describing the embodiments or the prior art will be introduced briefly in the following, apparently, the drawings described below are only some of the embodiments of the present invention, the ordinary skilled person in the art can also obtain other drawings based on these drawings.

REFERENCE SIGNS

Figure 1:
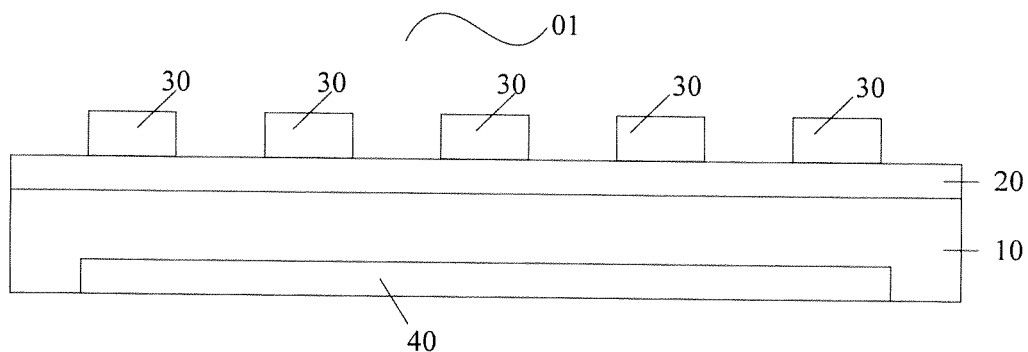
FIG. 1 is a structural schematic view I of a flexible display substrate according to an embodiment of the present invention.

01—flexible display substrate; 10—flexible substrate; 20—a first buffer layer; 30—display element; 301—thin film transistor; 302—pixel electrode; 303—common electrode; 304—anode; 305—cathode; 306—organic material functional layer; 40—light absorbing layer; 50—a second buffer layer; 60—encapsulation layer; 70—carrying substrate; 3011—gate; 3012—gate insulating layer; 3013—metal oxide semiconductor active layer; 3014—source; 3015—drain.

DETAILED DESCRIPTION OF THE INVENTION

The technical solutions in the embodiments of the present invention will be described clearly and completely in combination with the drawings in the embodiments of the present invention in the following, apparently, the embodiments described below are only a part of rather than all of the embodiments of the present invention. Based on the embodiments in the present invention, all the other embodiments obtained by the ordinary skilled person in the art without paying any creative work belong to the protection scope of the present invention.

The embodiments of the present invention provide a flexible display substrate 01, as shown in FIG. 1 to FIG. 7, the flexible display substrate 01 comprises: a flexible substrate 10, a first buffer layer 20 arranged on the flexible substrate 10, a plurality of display elements 30 arranged at a side of the first buffer layer 20 away from the flexible substrate 10, each of the plurality of display elements 30 comprising a thin film transistor 301 and an electrode structure; further, the flexible display substrate 01 further comprises: a light absorbing layer 40 arranged at a lower surface of the flexible substrate 10 or arranged between the flexible substrate 10 and the plurality of display elements 30.

Wherein, the thin film transistor 301 comprises a gate 3011, a gate insulating layer 3012, a metal oxide semiconductor active layer 3013, a source 3014 and a drain 3015; certainly, on such a basis, the flexible display substrate 01 further comprises a gate line electrically connected with the gate 3011, a gate line lead (not shown in the figure), a data line electrically connected with the source 3014, a data line lead (not shown in the figure) etc.

The material of the metal oxide semiconductor active layer 3013 may be: zinc oxide (ZnO), indium gallium zinc oxide (IGZO), indium zinc oxide (InZnO), or zinc stannum oxide (ZnSnO), etc.

The material of the flexible substrate 10 may be polyimide, polycarbonate, polyacrylic ester, polyether imide, polyether sulphone, polyethylene glycol terephthalate and polyethylene glycol naphthalate, etc.

The first buffer layer 20 may be a monolayer or a multilayer structure, the material thereof for example may be silicon nitride (SiNx), silicon oxide (SiOx), aluminum oxide ($Al_2O_3$), aluminum nitride (AlN), etc.

It shall be noted that firstly, in embodiments of the present invention, the display element 30 may be understood as: for one of the smallest display units of the flexible display substrate 01, it is an indispensable structure consisting of patterns of respective layers arranged on the flexible substrate 10, and the flexible display substrate 01 comprises a number of such display elements.

For example, when the flexible display substrate 01 is an array substrate of liquid crystal display (LCD), for one of the smallest display units of the array substrate, the display element 30 at least comprises a thin film transistor 301, a pixel electrode 302, etc.; when the flexible display substrate 01 is an organic light-emitting diode (OLED), for one of the smallest display units, the display element 30 at least comprises an anode 304, a cathode 305 and an organic material functional layer 306.

Certainly, in addition, the flexible display substrate 01 may further comprise some other pattern layers, e.g. a protection layer, etc., or may also comprise e.g. some pattern layers added for improving the display effect.

The thin film transistor 301 is a semiconductor unit with switching characteristics, it may be either a top gate type or a bottom gate type, which will not be restricted here. Wherein the top gate and the bottom gate are defined relative to the positions of the gate 3011 and the gate insulating layer 3012, i.e., relative to the flexible substrate 10, when the gate 3011 is close to the flexible substrate 10, and the gate insulating layer 3012 is away from the flexible substrate 10, the thin film transistor 301 is a bottom gate type thin film transistor; when the gate 3011 is away from the flexible substrate 10 and the gate insulating layer 3012 is close to the flexible substrate 10, the thin film transistor 301 is a top gate type thin film transistor.

In the embodiments of the present invention, due to the limitation of the material of the flexible substrate 10, a hard substrate (e.g. a glass substrate) needs to be used as the carrying substrate in the process of manufacturing the flexible display substrate 01, on which respective film layers of the flexible display substrate 01 are formed, then the carrying substrate is stripped by e.g. laser irradiation.

Therefore, in the embodiments of the present invention, the thickness and the light transmittance of the material and so on of the light absorbing layer 40 can be set, so as to avoid the light energy of the laser from influencing the performance of the thin film transistor 301 as far as possible in the case of stripping the flexible substrate 10 from the carrying substrate.

Here, the material of the light absorbing layer 40 can be any materials that can absorb light energy and have corresponding light transmittance.

For the sake of conciseness, the drawings according to the embodiments of the present invention schematically show the pattern layers related to the technical solutions of this disclosure, while for the pattern layers unrelated to the technical solutions of this disclosure, they are not shown or only part of them are shown.

The embodiments of the present invention provide a flexible display substrate 01 comprising: a flexible substrate 10, a first buffer layer 20 arranged on the flexible substrate 10, a plurality of display elements 30 arranged at a side of the first buffer layer 20 away from the flexible substrate 10, each of the plurality of display elements 30 comprising a thin film transistor 301 and an electrode structure; wherein the thin film transistor 301 comprises a metal oxide semiconductor active layer 3013; further, the flexible display substrate 01 further comprises: a light absorbing layer 40 arranged at a lower surface of the flexible substrate 10 or arranged between the flexible substrate 10 and the plurality of display elements 30.

By using a metal oxide semiconductor as the material of the active layer, the thin film transistor can have a higher electron mobility and homogeneity, so as to enable it to be applicable to a large-size flexible display substrate. However, the performance of the thin film transistor comprising a metal oxide semiconductor active layer may be influenced by light energy. By arranging the light absorbing layer 40, the light energy of e.g., laser can be absorbed in the case of ensuring stripping of the carrying substrate and the flexible substrate 10, thereby weakening the light energy that reaches the thin film transistor 301 as far as possible, so as to avoid influence to the performance of the thin film transistor 301 and improve yield of the product.

Optionally, the light absorbing layer 40 may be an amorphous silicon layer; or it may also be an indium tin oxide (ITO) layer.

Further, considering that if the thickness of the light absorbing layer 40 is too small, its absorption of the light energy would be unobvious, if the thickness of the light absorbing layer 40 is too large, it would result in over large of the whole thickness of the flexible display substrate 01, which goes against the requirement of lightness and thinness of display device. Therefore, in an embodiment of the present invention, the thickness of the light absorbing layer formed by an amorphous silicon layer can be in a range of 40-70 nm.

Optionally, the position of the light absorbing layer 40 may be set in several cases as follows:

In the first case, as shown in FIG. 1, the light absorbing layer 40 is arranged at the lower surface of the flexible substrate 10. Namely, before performing e.g. laser irradiation to strip the flexible substrate 10 from the carrying substrate, the light absorbing layer 40 is arranged between the carrying substrate and the flexible substrate 10. In this way, the flexible substrate 10 can be stripped from the carrying substrate in the at the time of laser irradiation, wherein part or all of the light absorbing layer 40 will remain at the lower surface of the flexible substrate 10. Since the light absorbing layer 40 can absorb light energy, it can be used for protecting the thin film transistor 301 located above.

Figure 2:
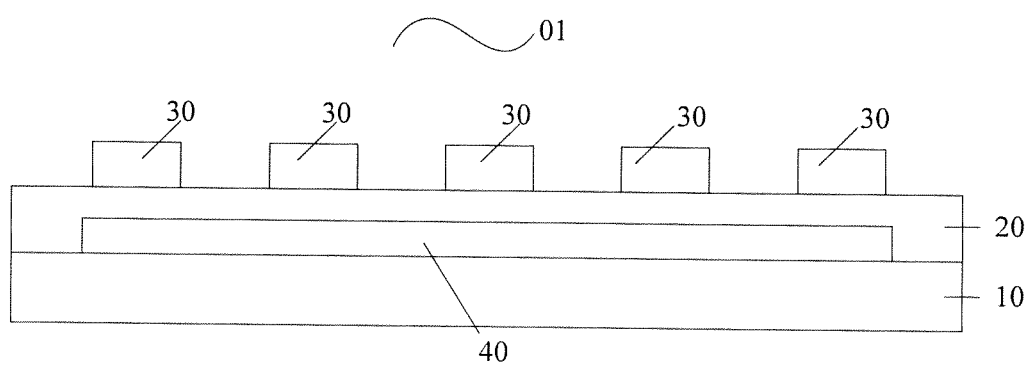
FIG. 2 is a structural schematic view II of a flexible display substrate according to an embodiment of the present invention.

In the second case, as shown in FIG. 2, the light absorbing layer 40 is arranged between the flexible substrate 10 and the first buffer layer 20, and the light absorbing layer 40 contacts with both the flexible substrate 10 and the first buffer layer 20. Namely, before performing e.g. laser irradiation to strip the flexible substrate 10 from the carrying substrate, the side of the flexible substrate 10 away from the light absorbing layer 40 contacts with the carrying substrate directly. In this way, the light energy of the laser strips the flexible substrate 10 from the carrying substrate from at the time of laser irradiation. The light energy transferred to the above of the flexible substrate 10 can be absorbed by the light absorbing layer 40, thereby protecting the thin film transistor 301 located above.

Wherein the first buffer layer 20 can be used for blocking water and oxygen and can also be used for planarization, and can also prevent the light absorbing layer 40 of a semiconductor or conductor material and the electrode of the thin film transistor 301 close to the light absorbing layer 40 from forming capacitance.

Figure 3:
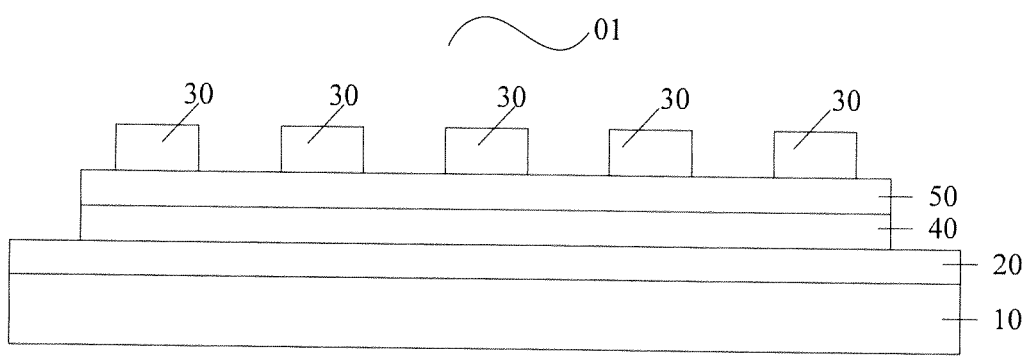
FIG. 3 is a structural schematic view III of a flexible display substrate according to an embodiment of the present invention.

In the third case, as shown in FIG. 3, the light absorbing layer 40 is arranged between the first buffer layer 20 and the plurality of display elements 30. Namely, before performing e.g. laser irradiation to strip the flexible substrate 10 from the carrying substrate, the side of the flexible substrate 10 away from the first buffer layer 20 contacts with the carrying substrate directly. In this way, the light energy of the laser strips the flexible substrate 10 from the carrying substrate at the time of laser irradiation. The light energy transferred to the above of the flexible substrate 10 can be absorbed by the light absorbing layer 40, thereby protecting the thin film transistor 301 located above.

In such a case, a second buffer layer 50 can be arranged at the side of the light absorbing layer 40 away from the first buffer layer 20, and the light absorbing layer 40 contacts with both the first buffer layer 20 and the second buffer layer 50. Wherein the first buffer layer 20 can be used for blocking water and oxygen and can also be used for planarization; the second buffer layer 50 can prevent the light absorbing layer 40 of a semiconductor or conductor material and the electrode of the thin film transistor 301 close to the light absorbing layer 40 from forming capacitance.

Based on the above three cases, it should be explained that:

Firstly, since the light absorbing layer 40 is arrange for preventing damage to the thin film transistor 301 in e.g. laser irradiation, the light absorbing layer 40 needs to correspond to all the thin film transistors 301 in a pixel area.

Figure 4:
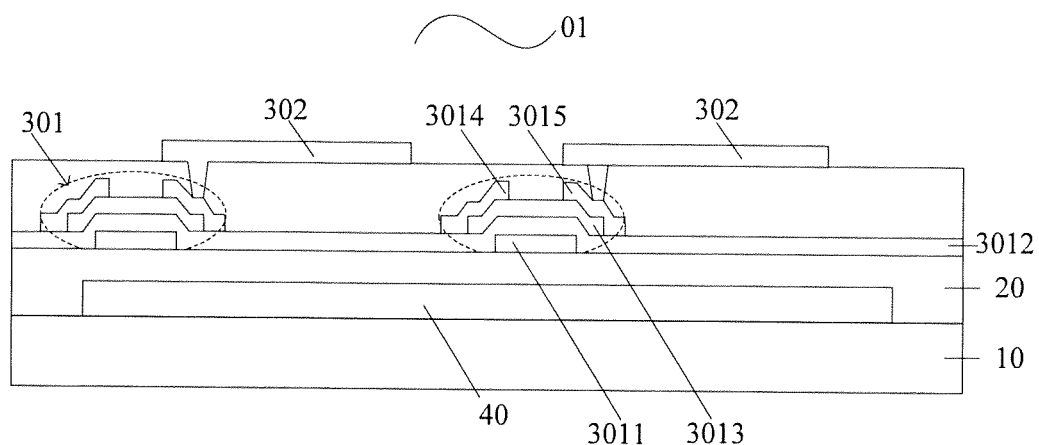
FIG. 4 is a structural schematic view of a flexible display substrate comprising a pixel electrode according to an embodiment of the present invention.
Figure 5:
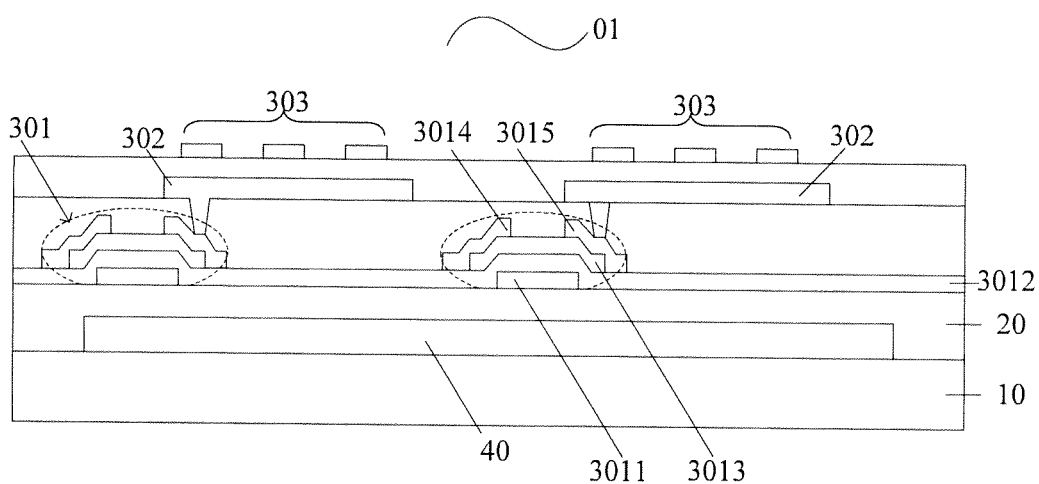
FIG. 5 is a structural schematic view I of a flexible display substrate comprising a pixel electrode and a common electrode according to an embodiment of the present invention.
Figure 6:
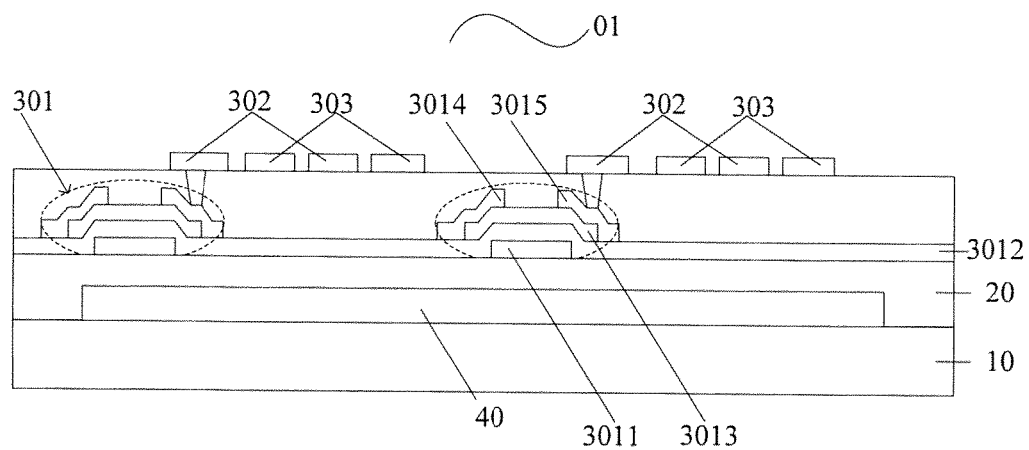
FIG. 6 is a structural schematic view II of a flexible display substrate comprising a pixel electrode and a common electrode according to an embodiment of the present invention.
Figure 7:
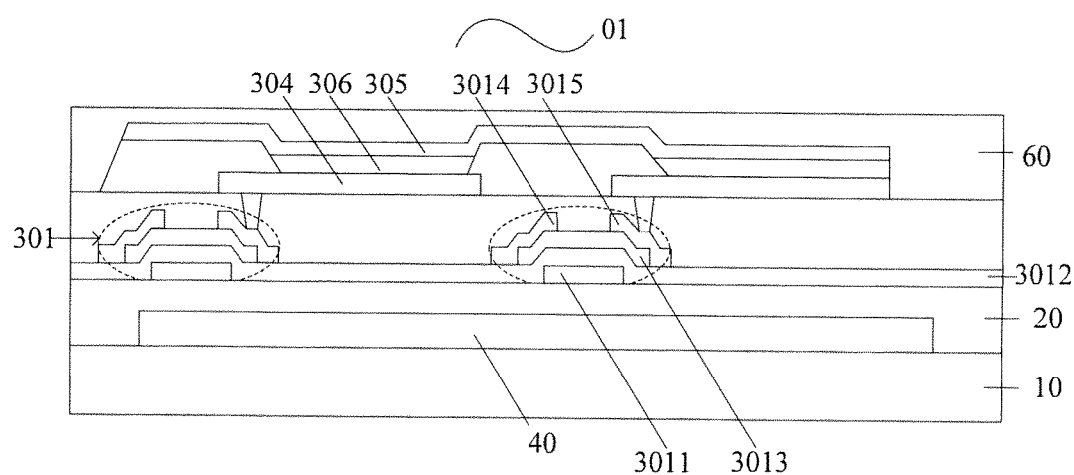
FIG. 7 is a structural schematic view of a flexible display device comprising an anode, a cathode, and an organic material functional layer according to an embodiment of the present invention.

Secondly, the above display element can be e.g. a display element 30 comprising a thin film transistor 301 and a pixel electrode 302 as shown in FIG. 4, and may also be e.g. a display element 30 comprising a thin film transistor 301, a pixel electrode 302 and a common electrode 303 as shown in FIG. 5 and FIG. 6, certainly, it may also be e.g. a display element 30 comprising a thin film transistor 301, an anode 304, a cathode 305 and an organic material functional layer 306 as shown in FIG. 7.

Thirdly, in the event that the light absorbing layer 40 comprises an amorphous silicon layer, the area of the amorphous silicon layer is smaller than the area of the first buffer layer 20; wherein an edge of the light absorbing layer 40 is aligned with the organic material functional layer 306 of the display element in the plurality of display elements 30 located at an edge of the flexible display substrate.

This is because when the display element 30 is a display element comprising a thin film transistor 301, an anode 304, a cathode 305 and an organic material functional layer 306, in general, the filming position of the organic material functional layer 306 on the substrate in its preparation is controlled by means of a mask, while the amorphous silicon layer is not completely transparent, thus an accurate alignment may not be achieved when evaporating the organic material functional layer 306. Therefore, according to an embodiment of the present invention, the periphery of the light absorbing layer 40 is etched off. In this way, the alignment with the mask can be achieved through the edge of the light absorbing layer 40 when evaporating the organic material functional layer 306, thereby enabling accurate alignment.

In addition, in order to enable the alignment to be more accurate, the second buffer layer 50 and the amorphous silicon layer located under it can be etched.

As shown in FIG. 4, when the flexible display substrate 01 is an array substrate of LCD, the electrode structure may comprise a pixel electrode 302, the pixel electrode 302 is electrically connected with the drain 3015 of the thin film transistor 301.

As shown in FIG. 5 and FIG. 6, the electrode structure may further comprise a pixel electrode 302 and a common electrode 303 at the same time. In such a case, the display element 30 may further comprise an interlayer insulating layer. Wherein for an in-plane switching (IPS) array substrate, as shown in FIG. 6, the pixel electrode 302 and the common electrode 303 are arranged at intervals in the same layer, and are both strip electrodes; for an advanced-super dimensional switching (ADS) array substrate, as shown in FIG. 5, the pixel electrode 302 and the common electrode 303 are arranged in different layers, wherein the upper electrode is a strip electrode, the lower electrode is a plate electrode or a strip electrode.

As shown in FIG. 7, when the flexible display substrate 01 is a back plate of an OLED, the electrode structure comprises an anode 304 and a cathode 305, one of the anode 304 and the cathode 305 is electrically connected with the drain 3015 of the thin film transistor 301. In such a case, the display element 30 further comprises an organic material functional layer 306 arranged between the anode 304 and the cathode 305; the organic material functional layer 306 may comprise an electron transport layer, a light emitting layer and a hole transport layer. In order to improve the efficiency of injecting electrons and holes into the light emitting layer, the organic material functional layer 306 may further comprises an electron injection layer arranged between the cathode 305 and the electron transport layer, and a hole injection layer between the anode 304 and the hole transport layer.

The embodiments of the present invention further provide a flexible display device comprising any of the above flexible display substrates. The flexible display device may be any products or components with the display function such as a liquid crystal panel, an electronic paper, an OLED panel, a mobile phone, a tablet computer, a display, a laptop, a digital photo frame, a navigator, etc.

When the flexible display substrate 01 is a back plate of an OLED, the flexible display substrate 01 may comprise an anode 304, a cathode 305, a thin film transistor 301 and an organic material functional layer 306. Due to particularity of the material of the organic material functional layer 306, after the above display structure is fabricated, as shown in FIG. 7, an encapsulation layer 60 for encapsulating the organic material is further formed so as to block water and oxygen, thereby forming a flexible display device.

According to materials of the anode 304 and the cathode 305, the flexible display device can be classified into a flexible display device of a single-side light emission type and a flexible display device of a double-side light emission type. Namely: when the material of one of the anode 304 and the cathode 305 is a non-transparent material, the flexible display device is of a single-side light emission type; when the materials of the anode 304 and the cathode 305 are both transparent materials, the flexible display device is of a double-side light emission type.

As for a flexible display device of a single-side light emission type, according to materials of the anode 304 and the cathode 305, it may be further classified into an upper light emission type and a lower light emission type. Specifically, when the anode 304 is arranged close to the flexible substrate 10, the cathode 305 is arranged away from the flexible substrate 10 and the material of the anode 304 is a transparent conductive material, the material of the cathode 305 is a non-transparent conductive material, since the light is emitted from the anode 304 and then via one side of the flexible substrate 10, the flexible display device therefore can be called a flexible display device of a lower light emission type. When the material of the anode 304 is a non-transparent conductive material, and the material of the cathode 305 is a transparent or a translucent conductive material, since the light is emitted from the cathode 305 and then via the encapsulation layer 60 arranged opposite to the flexible substrate 10, the flexible display device therefore can be called a flexible display device of an upper light emission type. Certainly, the relative positions of the above anode 304 and the cathode 305 can also be exchanged, which will not be repeated here.

Wherein the encapsulation layer 60 may be either a flexible encapsulation substrate or a layer of thin film, which will not be restricted here.

As for a flexible display device of a double-side light emission type, when the anode 304 is arranged close to the flexible substrate 10, the cathode 305 is arranged away from the flexible substrate 10, or when the anode 304 is arranged away from the flexible substrate 10, the cathode 305 is arranged close to the flexible substrate 10, and the materials of the anode 304 and the cathode 305 are transparent or translucent conductive materials (e.g. ITO, indium tin oxides) or metal materials with relatively small thickness, since the light is emitted from the anode 304 and then via one side of the flexible substrate 10, and is further emitted from the cathode 305 and then via the encapsulation layer 60 arranged opposite to the flexible substrate 10, the flexible display device therefore can be called a flexible display device of a double-side light emission type.

Figure 8:
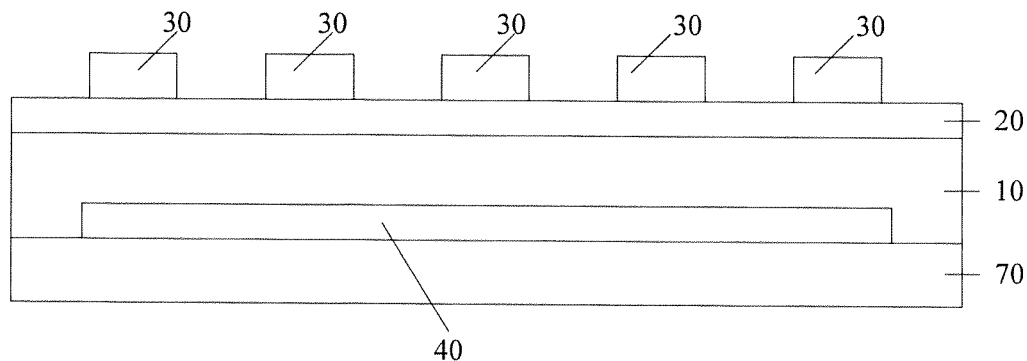
FIG. 8 is a schematic view I of the process of manufacturing a flexible display substrate according to an embodiment of the present invention.
Figure 9:
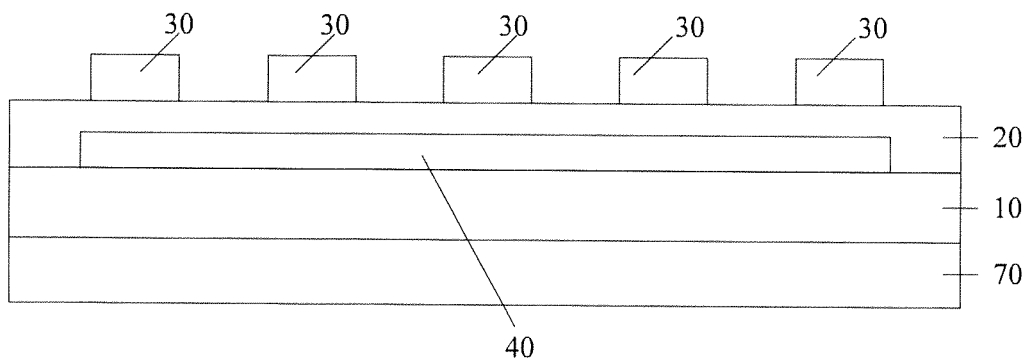
FIG. 9 is a schematic view II of the process of manufacturing a flexible display substrate according to an embodiment of the present invention.
Figure 10:
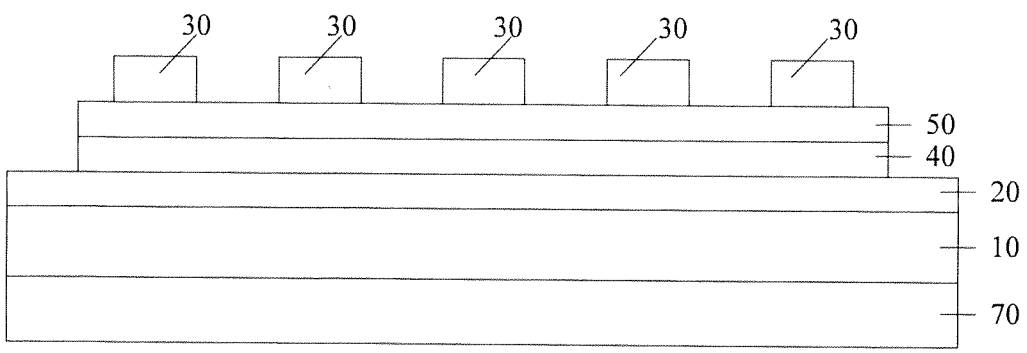
FIG. 10 is a schematic view III of the process of manufacturing a flexible display substrate according to an embodiment of the present invention.

The embodiments of the present invention further provide a method for manufacturing a flexible display substrate, as shown in FIG. 8 to FIG. 10, the method comprises: forming a flexible substrate 10 on a carrying substrate 70; forming a first buffer layer 20 on the flexible substrate 10; forming a plurality of display elements 30 on the first buffer layer 20, each of the plurality of display elements 30 comprising a thin film transistor 301 and an electrode structure, the thin film transistor 301 comprising a metal oxide semiconductor active layer 3013; stripping the flexible substrate 10 from the carrying substrate 70. Wherein the method further comprises: forming a light absorbing layer 40 before the plurality of display elements 30 are formed.

It needs to be explained that:

Firstly, the thin film transistor 301 can be either a top gate type or a bottom gate type, which will not be restricted here.

Secondly, the material of the light absorbing layer 40 may be any material that can absorb light energy and have corresponding light transmittance.

Thirdly, the forming position of the light absorbing layer 40 is not restricted. For example, it can be formed at any position between the carrying substrate 70 and the display element 30, as long as it can avoid damage of light energy of e.g. laser to the thin film transistor 301 when stripping the flexible substrate 10 from the carrying substrate 70.

The embodiments of the present invention provide a method for manufacturing a flexible display substrate, which comprises: forming a flexible substrate 10 on a carrying substrate 70; forming a first buffer layer 20 on the flexible substrate 10; forming a plurality of display elements 30 on the first buffer layer 20, each of the plurality of display elements 30 comprising a thin film transistor 301 and an electrode structure, the thin film transistor 301 comprising a metal oxide semiconductor active layer 3013; stripping the flexible substrate 10 from the carrying substrate 70. Wherein the method further comprises: forming a light absorbing layer 40 before the plurality of display elements 30 are formed.

By using a metal oxide semiconductor as the material of the active layer, the thin film transistor can have a higher electron mobility and homogeneity, so as to enable it to be applicable to a large-size flexible display substrate. However, the performance of the thin film transistor comprising a metal oxide semiconductor active layer may be influenced by light energy. By arranging the light absorbing layer 40, the light energy of e.g. laser can be absorbed in the case of ensuring the carrying substrate is stripped from the flexible substrate 10, thereby weakening the light energy that reaches the thin film transistor 301 as far as possible, so as to avoid influence to the performance of the thin film transistor 301 and improve yield of the product.

Optionally, the light absorbing layer 40 may be an amorphous silicon layer; or it may also be an ITO layer.

Further, considering that if the thickness of the light absorbing layer 40 is too small, its absorption of the light energy would be unobvious, if the thickness of the light absorbing layer 40 is too large, it would result in over large of the whole thickness of the flexible display substrate 01, which goes against the requirement of lightness and thinness of display device. Therefore, in an embodiment of the present invention, the thickness of the light absorbing layer formed by an amorphous silicon layer can be in a range of 40-70 nm.

Optionally, the manufacturing method of the flexible display substrate 01 can be carried out in the following several ways specifically:

In the first way: as shown in FIG. 8, a light absorbing layer 40 is formed on a carrying substrate 70, a flexible substrate 10 is formed on the light absorbing layer 40, a first buffer layer 20 is formed on the flexible substrate 10, a plurality of display elements 30 are formed on the first buffer layer 20, the flexible substrate 10 is stripped from the carrying substrate 70 by way of laser irradiation to obtain the flexible display substrate 01 as shown in FIG. 1. It should be noted that the light absorbing layer 40 contacts with the flexible substrate 10; the light absorbing layer 40 can either contact or not contact with the carrying substrate 70. For example, other film layer such as a sacrificial layer can be formed between the carrying substrate 70 and the light absorbing layer 40 for assisting the flexible display substrate 01 to be stripped from the carrying substrate 70.

In the second way: as shown in FIG. 9, the flexible substrate 10 is formed on the carrying substrate 70, the light absorbing layer 40 is formed on the flexible substrate 10, the first buffer layer 20 is formed on the light absorbing layer 40, a plurality of display elements 30 are formed on the first buffer layer 20, the flexible substrate 10 is stripped from the carrying substrate 70 by way of laser irradiation to obtain the flexible display substrate 01 as shown in FIG. 2. Wherein the light absorbing layer 40 contacts with both the flexible substrate 10 and the first buffer layer 20.

In the third way: as shown in FIG. 10, the flexible substrate 10 is formed on the carrying substrate 70, the first buffer layer 20 is formed on the flexible substrate 10, the light absorbing layer 40 is formed on the first buffer layer, a second buffer layer 50 is formed on the light absorbing layer 40, a plurality of display elements 30 are formed on the second buffer layer 50, the flexible substrate 10 is stripped from the carrying substrate 70 by way of laser irradiation to obtain the flexible display substrate 01 as shown in FIG. 3. Wherein the light absorbing layer 40 contacts with both the first buffer layer 20 and the second buffer layer 50.

Based on the above description, as shown in FIG. 4, when the flexible display substrate 01 is an array substrate of a LCD, forming the display elements 30 may be specifically: forming a thin film transistor 301 and a pixel electrode 302 electrically connected with the drain 3015 of the thin film transistor 301.

Certainly, as shown in FIG. 5 and FIG. 6, a common electrode 303 may be further formed.

As shown in FIG. 7, when the flexible display substrate 01 is a back plate of an OLED, forming the display elements 30 may be specifically: forming the thin film transistor 301, an anode 304, an organic material functional layer 306, a cathode 305, one of the cathode 305 and the anode 304 being electrically connected with the drain 3015 of the thin film transistor 301. Thus, the manufacture of the flexible display substrate 01 is accomplished.

In addition, after the display elements 30 are formed and before the flexible substrate 10 is stripped from the carrying substrate 70, an encapsulation layer 60 can also be formed for encapsulating the organic material, so as to block water and oxygen.

In the case that the light absorbing layer 40 comprises an amorphous silicon layer, the area of the amorphous silicon layer is smaller than the area of the first buffer layer 20; wherein the edge of the light absorbing layer 40 is aligned with the organic material functional layer 306 of the display element in the plurality of display elements 30 located at the edge of the flexible display substrate.

This is because when the display element 30 is a display element comprising a thin film transistor 301, an anode 304, a cathode 305 and an organic material functional layer 306, in general, the filming position of the organic material functional layer 306 on the substrate in its preparation is controlled by means of a mask, while the amorphous silicon layer is not completely transparent, thus an accurate alignment may not be achieved when evaporating the organic material functional layer 306. Therefore, according to an embodiment of the present invention, the periphery of the light absorbing layer 40 is etched off. In this way, the alignment with the mask can be achieved through the edge of the light absorbing layer 40 when evaporating the organic material functional layer 306, thereby enabling accurate alignment.

In addition, in order to enable the alignment to be more accurate, the second buffer layer 50 and the amorphous silicon layer located under it can be etched.

Figure 11:
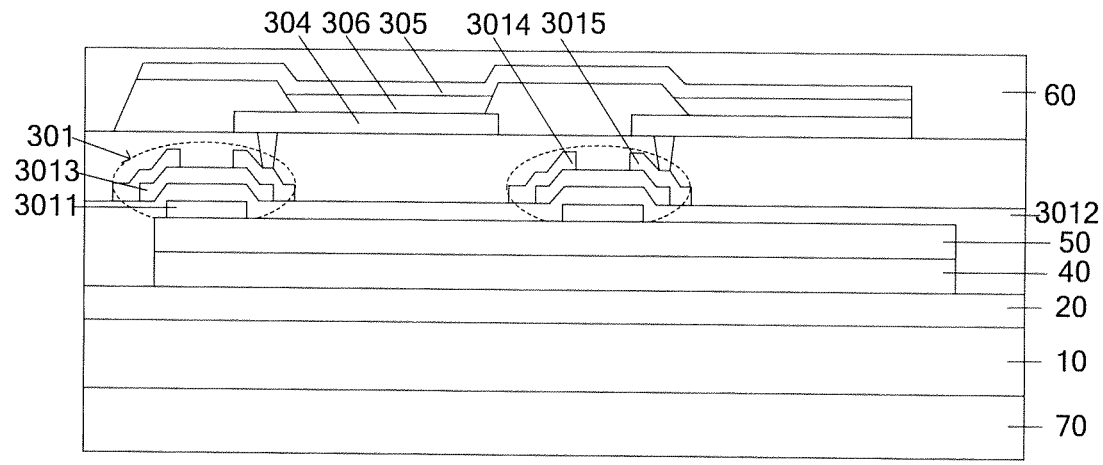
FIG. 11 is a schematic view of the process of manufacturing a flexible display device according to a specific embodiment of the present invention.

Next a specific example will be provided to described a method for manufacturing the above flexible display device in detail. The method comprises the steps of:

S101, as shown in FIG. 11, a layer of polyimide film is deposited on the carrying substrate 70 to form a flexible substrate 10.

The thickness of the flexible substrate 10 may be 10 μm.

S102, as shown in FIG. 11, a layer of silicon nitride (SiNx) film is deposited on the flexible substrate 10 to form a first buffer layer 20.

The thickness of the first buffer layer 20 may be 200 nm.

In this step, besides the SiNx, aluminum oxide ($Al_2O_3$), aluminum nitride (AlN), silicon nitride (SiNx), silicon oxide (SiOx), etc. can also be deposited.

S103, as shown in FIG. 11, a layer of amorphous silicon (a-Si) film is deposited on the first buffer layer 20, a layer of SiNx film is deposited on the amorphous silicon film, and the peripheries of the a-Si film and the SiNx film are etched off through a patterning process, a light absorbing layer 40 and a second buffer layer 50 located on the light absorbing layer 40 are formed.

The thickness of the light absorbing layer 40 may be 45 nm, the thickness of the second buffer layer 50 may be 200 nm.

S104, as shown in FIG. 11, a gate 3011, a gate insulating layer 3012, a metal oxide semiconductor active layer 3013, a source 3014 and a drain 3015 are formed on the resulting structure sequentially.

S105, as shown in FIG. 11, an anode 304, an organic material functional layer 306, a cathode 305 are formed on the resulting structure sequentially, the anode 304 is electrically connected with the drain 3015.

Wherein, when the organic material functional layer 306 is formed by evaporation, the alignment with the mask can be achieved through the edges of the light absorbing layer 40 and the second buffer layer 50, so as to enable the organic material functional layer 306 of each sub-pixel to form at an appropriate position.

S106, as shown in FIG. 11, an encapsulation layer 60 is used to perform encapsulation.

Figure 12:
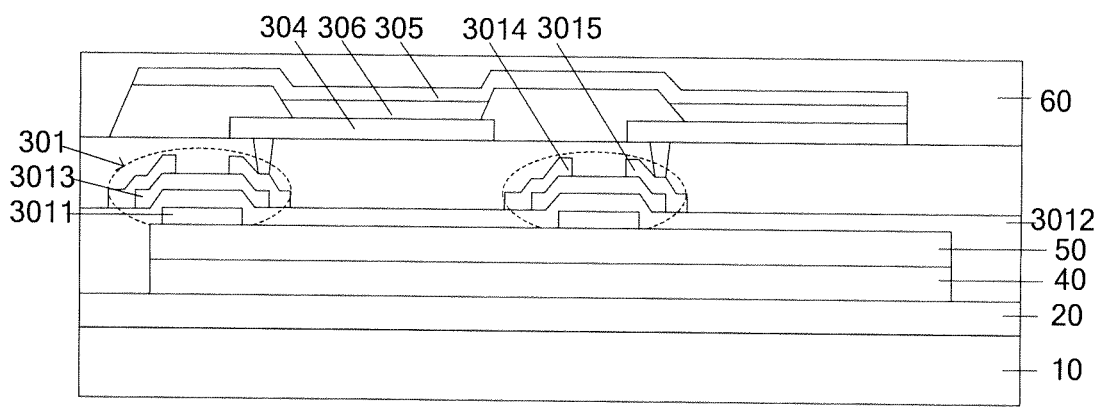
FIG. 12 is a structural schematic view of a flexible display device which is manufactured according to a specific embodiment of the present invention.

S107, the flexible substrate 10 is stripped from the carrying substrate 70 by means of laser irradiation to obtain the flexible display device as shown in FIG. 12.

In the embodiments of the present invention, in the case that the flexible substrate 10 is stripped from the carrying substrate 70, the light energy of laser can be absorbed by the light absorbing layer 40, thereby weakening the light energy that reaches the thin film transistor 301 as far as possible, so as to avoid influence to the performance of the thin film transistor 301 and improve yield of the product. In addition, by etching off the peripheries of the light absorbing layer 40 and the second buffer layer 50, the alignment accuracy when evaporating the organic material can be improved.

What is stated above is merely embodiments of the present invention, however, the protection scope of the present invention is not limited to this. An ordinary skilled person in the art can easily conceive variations or replacements within the technical scope disclosed by the present invention, all these variations or replacements should be encompassed within the protection scope of the present invention. Therefore, the protection scope of the present invention should be based on that of the appended claims.

The invention claimed is:

1. A flexible display substrate comprising: a flexible substrate, a first buffer layer arranged on the flexible substrate, a plurality of display elements arranged at a side of the first buffer layer away from the flexible substrate, each of the plurality of display elements comprising a thin film transistor; wherein the thin film transistor comprises a metal oxide semiconductor active layer, wherein the flexible display substrate further comprises a continuous light absorbing layer arranged at a lower surface of the flexible substrate or arranged between the flexible substrate and the plurality of display elements, wherein each of the plurality of display elements comprises an organic light emitting diode, the organic light emitting diode including a cathode, an anode and an organic material functional layer, wherein one of the cathode and the anode is electrically connected with a drain of the thin film transistor, wherein the light absorbing layer comprises an amorphous silicon layer, and an area of the amorphous silicon layer is smaller than that of the first buffer layer, wherein an edge of the continuous light absorbing layer is aligned with the organic material functional layer of the organic light emitting diode that is located at an edge of the flexible display substrate.

2. The flexible display substrate according to claim 1, wherein the light absorbing layer is arranged between the flexible substrate and the first buffer layer, and the light absorbing layer contacts with both the flexible substrate and the first buffer layer.

3. The flexible display substrate according to claim 1, wherein the light absorbing layer is arranged between the first buffer layer and the display elements;

the flexible display substrate further comprises a second buffer layer arranged between the light absorbing layer and the plurality of display elements, and the light absorbing layer contacts with both the first buffer layer and the second buffer layer.

4. A flexible display device comprising a flexible display substrate, the flexible display substrate comprising: a flexible substrate, a first buffer layer arranged on the flexible substrate, a plurality of display elements arranged at a side of the first buffer layer away from the flexible substrate, each of the plurality of display elements comprising a thin film transistor; wherein the thin film transistor comprises a metal oxide semiconductor active layer, wherein the flexible display substrate further comprises a continuous light absorbing layer arranged at a lower surface of the flexible substrate or arranged between the flexible substrate and the plurality of display elements, wherein each of the plurality of display elements comprises an organic light emitting diode, the organic light emitting diode including a cathode, an anode and an organic material functional layer, wherein one of the cathode and the anode is electrically connected with a drain of the thin film transistor, wherein the light absorbing layer comprises an amorphous silicon layer, and an area of the amorphous silicon layer is smaller than that of the first buffer layer, wherein an edge of the continuous light absorbing layer is aligned with the organic material functional layer of the organic light emitting diode that is located at an edge of the flexible display substrate.

5. The flexible display device according to claim 4, further comprising an encapsulation layer.

6. The flexible display device according to claim 4, wherein the light absorbing layer is arranged between the first buffer layer and the plurality of display elements; the flexible display substrate further comprises a second buffer layer arranged between the light absorbing layer and the plurality of display elements, and the light absorbing layer contacts with both the first buffer layer and the second buffer layer.

* * * * *